US012690171B2

(12) United States Patent
Shang et al.

(10) Patent No.: US 12,690,171 B2
(45) Date of Patent: Jul. 21, 2026

(54) ELECTRIC CONTROL COMPONENT, AIR CONDITIONER HAVING SAME, AND ASSEMBLY METHOD FOR ELECTRIC CONTROL COMPONENT

(71) Applicants:FOSHAN SHUNDE MIDEA ELECTRIC SCIENCE AND TECHNOLOGY CO., LTD., Foshan (CN); GD MIDEA AIR-CONDITIONING EQUIPMENT CO., LTD., Foshan (CN)

(72) Inventors: Zhiguo Shang, Foshan (CN); Mingming Wang, Foshan (CN); Kun Zhou, Foshan (CN); Weijian Zhou, Foshan (CN); Jiahui Zhu, Foshan (CN)

(73) Assignees: FOSHAN SHUNDE MIDEA ELECTRIC SCIENCE AND TECHNOLOGY CO., LTD., Shunde (CN); GD MIDEA AIR-CONDITIONING EQUIPMENT CO., LTD., Shunde (CN)

( * ) Notice: Subject to any disclaimer, the term of this patent is extended or adjusted under 35 U.S.C. 154(b) by 319 days.

(21) Appl. No.: 18/200,953

(22) Filed: May 23, 2023

(65) Prior Publication Data

US 2023/0301030 A1 Sep. 21, 2023

Related U.S. Application Data

(63) Continuation of application No. PCT/CN2021/081123, filed on Mar. 16, 2021.

(30) Foreign Application Priority Data

Nov. 30, 2020 (CN) .......................... 202011385090.2
Nov. 30, 2020 (CN) .......................... 202022841021.X

(51) Int. Cl.
H05K 7/20 (2006.01)
H05K 1/02 (2006.01)

(52) U.S. Cl.
CPC ........... *H05K 7/205* (2013.01); *H05K 1/0201* (2013.01)

(58) Field of Classification Search
CPC ..................................................... H05K 7/205
(Continued)

(56) References Cited

U.S. PATENT DOCUMENTS

2004/0028315 A1 2/2004 Weigel
2007/0236888 A1 10/2007 Eckberg et al.

FOREIGN PATENT DOCUMENTS

CN 2831702 Y 10/2006
CN 101541158 A 9/2009
(Continued)

OTHER PUBLICATIONS

International Search Report dated Aug. 20, 2021 received in International Application No. PCT/CN2021/081123 together with English language translation.
(Continued)

*Primary Examiner* — Stanley Tso
(74) *Attorney, Agent, or Firm* — Scully, Scott, Murphy & Presser, P.C.

(57) ABSTRACT

Provided are an electric control component, an air conditioner having the same, and an assembly method for the electric control component. The electric control component includes a circuit board, a chip, a radiator and a fixing member. The chip is disposed on the circuit board. The radiator is disposed at a side of the chip away from the circuit board. The fixing member is configured to rigidly connect the radiator to the circuit board. At least one of the circuit board and the radiator has an engagement portion
(Continued)

adapted to be engaged with a pre-tightening device for clamping the radiator and the circuit board.

16 Claims, 3 Drawing Sheets

(58) Field of Classification Search
USPC ......................................................... 174/252
See application file for complete search history.

(56) References Cited

FOREIGN PATENT DOCUMENTS

| | | | |
|----|-------------|---|---------|
| CN | 204180436 | * | 2/2015 |
| CN | 204180436 U | | 2/2015 |
| CN | 106572621 A | | 4/2017 |
| CN | 106684059 A | | 5/2017 |
| CN | 106941099 A | | 7/2017 |
| CN | 210328135 U | * | 4/2020 |
| CN | 112423561 A | | 2/2021 |
| CN | 213485496 U | | 6/2021 |
| DE | 102013005114 A1 | | 9/2014 |
| TW | M248206 U | | 10/2004 |

OTHER PUBLICATIONS

Rejection Decision dated Jun. 5, 2024 received in Chinese Patent Application No. CN 202011385090.2.

Second Office Action dated Apr. 2, 204 received in Chinese Patent Application No. CN 202111385090.2.

Written Opinion of the International Searching Authority dated Aug. 20, 2021 received in International Application No. PCT/CN2021/081123.

Supplementary European search report dated Apr. 30, 2024 received in European Patent Application No. EP 21896096.1.

First Office Action dated Oct. 25, 2024 received in Chinese Patent Application No. CN 202011385090.2.

* cited by examiner

<u>3</u>

F2

Backward ← → Forward

31

32

<u>1000</u>

<u>1A</u>

<u>1B</u>

<u>200</u>　　<u>100</u>　　<u>200</u>

ELECTRIC CONTROL COMPONENT, AIR CONDITIONER HAVING SAME, AND ASSEMBLY METHOD FOR ELECTRIC CONTROL COMPONENT

CROSS-REFERENCE TO RELATED APPLICATIONS

The present application is a continuation application of International Application No. PCT/CN2021/081123, filed on Mar. 16, 2021, which claims priorities to and benefits of Chinese Patent Application No. 202011385090.2, filed on Nov. 30, 2020, and Chinese Patent Application No. 202022841021.X, filed on Nov. 30, 2020, the entire contents of each of which are incorporated herein by reference for all purposes. No new matter has been introduced.

FIELD

The present disclosure relates to the field of air conditioner technologies, and more particularly, to an electric control component, an air conditioner having the same, and an assembly method for the electric control component.

BACKGROUND

In the related art, for a circuit board of an intelligent power module with a patch, a radiator cannot be fixed by means of screws to dissipate heat from the intelligent power module. In general, an elastic snap is provided on the circuit board to fix the radiator on the circuit board. However, in this method, since intelligent power modules of different specifications have different sizes, the elastic snap or the radiator is required to be re-customized according to specific situations and has poor compatibility. In addition, such assembling method places high demands on processing precision. For example, the processing precision of the elastic snap is not up to standard, which may result in an assembly gap between the radiator and the intelligent power module. As a result, heat dissipation reliability can be affected.

SUMMARY

The present disclosure aims at solving at least one of the technical problems in the related art. To this end, the present disclosure provides an electric control component. The electric control component can effectively improve compatibility, ensure compression and heat dissipation effect of a chip and a radiator, and reduce processing difficulty.

The present disclosure further provides an air conditioner including the above electric control component.

According to one embodiment of the present disclosure, provided is an electric control component including a circuit board, a chip disposed on the circuit board, a radiator disposed at a side of the chip away from the circuit board, and a fixing member configured to rigidly connect the radiator to the circuit board. At least one of the circuit board and the radiator has an engagement portion adapted to be engaged with a pre-tightening device for clamping the radiator and the circuit board.

With the electric control component according to an embodiment of the present disclosure, assembling compatibility of the radiator and the circuit board can be effectively improved through a pre-clamping of the pre-tightening device and a rigid connection of the fixing member. In addition, it is possible to ensure the compression and heat dissipation effect of the chip and the radiator and reduce the processing difficulty.

In some embodiments, the fixing member is soldered to the circuit board, and/or the fixing member is riveted to the radiator.

In some embodiments, a first through hole is formed on the radiator. A first via hole is formed on the circuit board. The fixing member has a head portion and a rod portion. The head portion is riveted to the first through hole, and the rod portion passes through the first via hole and is soldered into the first via hole.

In some embodiments, a plane perpendicular to an axis of the rod portion is defined as a projection plane. A projection area of the head portion on the projection plane is greater than a projection area of the rod portion on the projection plane. The projection area of the head portion on the projection plane is greater than a projection area of the first via hole on the projection plane.

In some embodiments, the engagement portion includes a second through hole formed on the radiator, and a second via hole formed on the circuit board.

In some embodiments, the radiator includes a body portion, and two connection portions disposed on two sides of the body portion in a first direction. The second through hole is formed on each of the two connection portions.

In some embodiments, a first through hole is formed on each of the two connection portions, and the fixing member is engaged into the first through hole. The second through hole is spaced apart from the first through hole in a second direction intersecting with the first direction.

In some embodiments, two sides of the electric control component in the second direction are a first side and a second side, respectively. The second through hole on one of the two connection portions is located at the first side relative to the first through hole, and the first through hole on another one of the two connection portions is located at the second side relative to the second through hole.

In some embodiments, the first through hole has a diameter that is unequal to an diameter of the second through hole.

In some embodiments, the electric control component further includes the pre-tightening device engaged with the engagement portion and configured to clamp the radiator and the circuit board.

In some embodiments, the pre-tightening device is engaged with the engagement portion and configured to position the radiator and the circuit board in a plane perpendicular to a clamping direction.

In some embodiments, the engagement portion includes a second through hole formed on the radiator and a second via hole formed on the circuit board. The pre-tightening device further includes a mounting member passing through the second through hole and the second via hole.

In some embodiments, the pre-tightening device includes a spring member sleeved over the mounting member. The mounting member is configured to provide a reaction force for the spring member to allow the spring member to clamp the radiator and the circuit board through an elastic force.

In some embodiments, the mounting member includes a penetrating portion passing through the second through hole and the second via hole, a first abutting portion connected to the penetrating portion and limited on a side of the circuit board away from the radiator, and a second abutting portion connected to the penetrating portion and limited on a side of the radiator away from the circuit board. The spring member is disposed between the first abutting portion and the circuit board and/or between the second abutting portion and the radiator.

In some embodiments, the first abutting portion is a first elastic snap passing through the second via hole through elastic compression and limited on the side of the circuit board away from the radiator through elastic restoring force, and/or the second abutting portion is a second elastic snap passing through the second through hole through the elastic compression and limited on the side of the radiator away from the circuit board through the elastic restoring force.

In some embodiments, the mounting member is integrally formed.

In some embodiments, the radiator includes a body portion, and two connection portions disposed on two sides of the body portion in a first direction. The pre-tightening device and the fixing member are connected onto each of the two connection portions.

In some embodiments, the pre-tightening device and the fixing member on each of the two connection portions are spaced apart from each other in a second direction intersecting with the first direction.

In some embodiments, two sides of the electric control component in the second direction are a first side and a second side, respectively. The pre-tightening device on one of the two connection portions is located on the first side relative to the fixing member, and the pre-tightening device on another one of the two connection portions is located on the second side relative to the fixing member.

In some embodiments, a thermally conductive member is disposed between the radiator and the chip.

In some embodiments, the chip is an intelligent power module with a patch disposed on the circuit board.

According to one embodiment of the present disclosure, provided is an assembly method for an electric control component. The electric control component includes a circuit board, a chip, and a radiator. The chip is disposed on the circuit board, and the radiator is disposed at a side of the chip away from the circuit board. The assembly method includes clamping the radiator and the circuit board through a pre-tightening device, and connecting the radiator to the circuit board rigidly by a fixing member. In this way, assembling compatibility of the radiator and the circuit board can be effectively improved. In addition, it is possible to ensure the compression and heat dissipation effect of the chip and the radiator and reduce the processing difficulty.

In some embodiments, the assembly method for the electric control component further includes, subsequent to the connecting the radiator to the circuit board rigidly by the fixing member: removing the pre-tightening device.

According to one embodiment of the present disclosure, provided is an electric control component. The electric control component is assembled by the assembly method according to the embodiments as described above. In this way, assembling compatibility of the radiator and the circuit board can be effectively improved. In addition, it is possible to ensure the compression and heat dissipation effect of the chip and the radiator and reduce the processing difficulty.

According to one embodiment of the present disclosure, provided is an air conditioner including a plurality of power-consumption operation components, and the electric control component according to the embodiments as described above. The electric control component is electrically connected to at least one of the plurality of power-consumption operation components.

With the air conditioner according to the embodiments of the present disclosure, operation reliability of the air conditioner can be enhanced by the electric control component according to the embodiments as described above.

Additional aspects and advantages of the present disclosure will be provided at least in part in the following description, or will become apparent at least in part from the following description, or can be learned from practicing of the present disclosure.

Figure 1:
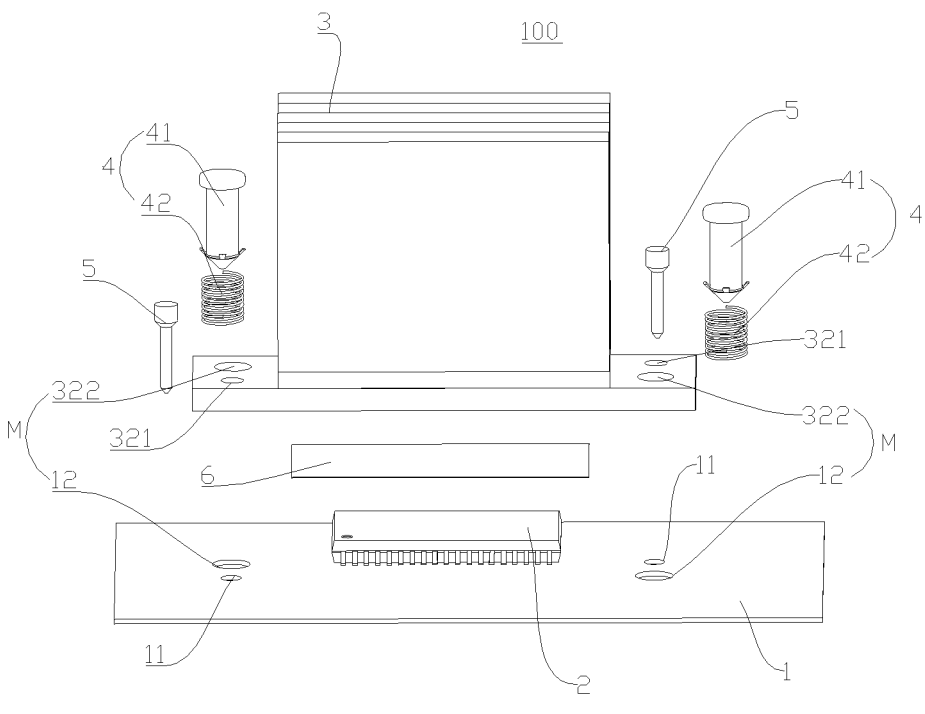
FIG. 1 is a schematic view of an electric control component according to an embodiment of the present disclosure.

REFERENCE NUMERALS air conditioner 1000; indoor unit 1A; outdoor unit 1B;

electric control component 100; first direction F1; second direction F2; first side F21; second side F22;

circuit board 1; first via hole 11; second via hole 12; chip 2;

radiator 3; body portion 31; connection portion 32; first through hole 321; second through hole 322;

pre-tightening device 4; mounting member 41; spring member 42; first abutting portion 411; penetrating portion 412; second abutting portion 413;

fixing member 5; head portion 51; rod portion 52;

thermally conductive member 6;

power-consumption operation component 200.

DETAILED DESCRIPTION

Embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limiting, the present disclosure.

Various embodiments or examples for implementing different structures of the present disclosure are provided below. In order to simplify the description of the present disclosure, components and configurations of specific examples are described below. These specific examples are merely for the purpose of illustration, rather than limiting the present disclosure. Further, the same reference numerals and/or reference letters may appear in different examples of the present disclosure for the purpose of simplicity and clarity, rather than indicating a relationship between different embodiments and/or the discussed configurations. In addition, the present disclosure provides examples of various specific processes and materials. However, applications of other processes and/or the use of other materials are conceivable for those of ordinary skill in the art.

An electric control component 100 according to embodiments of the present disclosure will be described below with reference to the drawings.

As illustrated in FIG. 1, according to the embodiments of the present disclosure, the electric control component 100 includes a circuit board 1, a chip 2, and a radiator 3. The chip 2 is disposed on the circuit board 1. The radiator 3 is disposed at a side of the chip 2 away from the circuit board 1. That is, the chip 2 is located between the radiator 3 and the circuit board 1. The radiator 3 is configured to dissipate heat from the chip 2.

As illustrated in FIG. 1, according to the embodiments of the present disclosure, the electric control component 100 further includes a fixing member 5. The fixing member 5 is configured to rigidly connect the radiator 3 to the circuit board 1. That is, by providing the fixing member 5, the radiator 3 and the circuit board 1 are rigidly connected to each other without relative movement therebetween.

As illustrated in FIG. 1, with the electric control component 100 according to the embodiments of the present disclosure, at least one of the circuit board 1 and the radiator 3 has an engagement portion M adapted to be engaged with a pre-tightening device 4 for clamping the radiator 3 and the circuit board 1. That is, the pre-tightening device 4 is configured to bring the radiator 3 and the chip 2 into a tight pressed state, i.e., bring a side surface of the radiator 3 facing towards the chip 2 to be in direct or indirect contact or attached with a side surface of the chip 2 facing towards the radiator 3, thereby ensuring that the radiator 3 can reliably and effectively dissipate heat from the chip 2.

In some embodiments, according to the embodiments of the present disclosure, the electric control component 100 may include or not include the pre-tightening device 4. During the assembling, the radiator 3 and the circuit board 1 may be clamped by means of the pre-tightening device 4, and then the radiator 3 and the circuit board 1 are rigidly connected to the circuit board 1 by means of the fixing member 5. After the radiator 3 is rigidly connected to the circuit board 1, the pre-tightening device 4 for clamping the radiator 3 and the circuit board 1 is no longer functioning, and may be selectively remained as required (in this case, the electric control component 100 as a product includes the pre-tightening device 4), or may be removed as required (in this case, the electric control component 100 as the product includes no pre-tightening device 4).

Therefore, during operation, the circuit board 1 and the radiator 3 are rigidly connected to each other by means of the fixing member 5 instead of the clamping of the pre-tightening device 4. Therefore, when the electric control component 100 is applied in a vibration environment, it is possible to improve heat dissipation reliability of the electric control component 100 in the vibration environment since the radiator 3 and the chip 2 can maintain in a reliable tight pressed state by means of the fixing member 5.

Moreover, with the electric control component 100 according to the embodiments of the present disclosure, during the assembling, since the radiator 3 and the chip 2 can be first tightly pressed against each other by means of the pre-tightening device 4, and the radiator 3 and the circuit board 1 are then rigidly connected to each other by means of the fixing member 5, it is possible to ensure that the radiator 3 and the chip 2 are in the tight pressed state. That is, the rigid connection is implemented in the case where it is ensured that the radiator 3 and the chip 2 are in the tight pressed state. Thus, it is possible to simply and effectively ensure that the radiator 3 and the chip 2 can still be in the tight pressed state after the radiator 3 is rigidly connected to the circuit board 1, thereby effectively ensuring the heat dissipation reliability of the radiator 3. Further, compared with a solution in which an elastic snap is provided on the circuit board in the related art, in the embodiments of the present disclosure, by clamping the radiator 3 and the circuit board 1 by means of the pre-tightening device 4, it is possible to effectively enhance compatibility and reduce processing difficulty.

Therefore, with the electric control component 100 according to the embodiments of the present disclosure, by providing the engagement portion M and the fixing member 5, it is possible for the circuit board 1 and the radiator 3 to automatically adjust clamping effect in a predetermined space by means of the pre-tightening device 4. Thereafter, the circuit board 1 and the radiator 3 are rigidly connected to each other by means of the fixing member 5. Thus, it is possible to ensure that no relative movement is generated between the circuit board 1 and the radiator 3. Therefore, the electric control component 100 can be applied in a static application scenario, and would not be affected by factors such as vibration in a dynamic application scenario, thereby ensuring that the radiator 3 can reliably dissipate heat from the chip 2. Moreover, after the fixing by means of the fixing member 5, it is possible to avoid generation of an assembly gap between the chip 2 and the radiator 3 caused by deformation or failure of the pre-tightening device 4 due to long-term load, which may affect heat dissipation effect.

Description will be provided below taking embodiments in which the electric control component 100 according to the embodiments of the present disclosure includes the pre-tightening device 4 (in an embodiment) and includes no pre-tightening device 4 (in another embodiment) as examples.

In one embodiment, as illustrated in FIG. 1, the electric control component 100 according to the embodiments of the present disclosure further includes a pre-tightening device 4. The pre-tightening device 4 is engaged with the engagement portion M for clamping the radiator 3 and the circuit board 1. In this way, with the electric control component 100 according to the embodiments of the present disclosure, by providing the pre-tightening device 4 and the fixing member 5, it is possible for the circuit board 1 and the radiator 3 to automatically adjust the clamping effect in a predetermined space by means of the pre-tightening device 4. Then, the circuit board 1 and the radiator 3 are rigidly connected to each other by means of the fixing member 5, which can ensure that no relative movement is generated between the circuit board 1 and the radiator 3. Therefore, the electric control component 100 can be applied in a static application scenario, and would not be affected by factors such as vibration in a dynamic application scenario, thereby ensuring that the radiator 3 can reliably dissipate heat from the chip 2. Moreover, after the fixing by means of the fixing member 5, it is possible to avoid generation of an assembly gap between the chip 2 and the radiator 3 caused by deformation or failure of the pre-tightening device 4 due to long-term load, which may affect heat dissipation effect.

In some embodiments of the present disclosure, the pre-tightening device 4 includes an elastic pressing device. The elastic pressing device is configured to clamp the radiator 3 and the circuit board 1 through an elastic force, thereby reliably ensuring the clamping effect. For example, the elastic pressing device may be a spring member 42, a pneumatic spring, and the like. To simplify the description, description will be provided below taking the spring member 42 serving as the elastic pressing device as an example. The spring member 42 is provided with a reaction force by the engagement portion M or other parts in the pre-tightening device 4 to clamp the radiator 3 and the circuit board 1 through the elastic force.

For example, in one embodiment, the engagement portion M may be fixed on the circuit board 1, and includes a first support point extending to a side of the radiator 3 away from the circuit board 1. The spring member 42 is sandwiched between the first support point and the radiator 3 to apply a pressure to the radiator 3 in a direction towards the circuit board 1 under a reaction force provided at the first support point, thereby enabling the radiator 3 and the chip 2 to be tightly pressed against each other.

For example, in another embodiment, the engagement portion M may be fixed on the radiator 3, and includes a second support point extending to a side of the circuit board 1 away from the radiator 3. The spring member 42 is sandwiched between the second support point and the circuit board 1 to apply a pressure to the circuit board 1 in a direction towards the radiator 3 under a reaction force provided at the second support point, thereby enabling the radiator 3 and the chip 2 to be tightly pressed against each other.

In some embodiments of the present disclosure, the pre-tightening device 4 is engaged with the engagement portion M, and configured to position the radiator 3 and the circuit board 1 in a plane perpendicular to a clamping direction. For example, a thickness direction of the circuit board 1 is defined as a longitudinal direction, and a direction in which a surface of the circuit board 1 is located is defined as a transverse direction. A prefabricated assembly 4 is configured to clamp the circuit board 1 and the radiator 3 in the longitudinal direction to avoid the relative movement between the circuit board 1 and the radiator 3 in the longitudinal direction. The prefabricated assembly 4 is engaged with the engagement portion M to position the radiator 3 and the circuit board 1 in the transverse direction, thereby avoiding the relative movement between the circuit board 1 and the radiator 3 in the transverse direction. Therefore, positioning effect can be realized through the engagement of the pre-tightening device 4 with the engagement portion M, thereby eliminating an additional positioning step, which in turn improves assembly efficiency and reduces assembly difficulty.

According to some embodiments of the present disclosure, as illustrated in FIG. 1, the engagement portion M includes a second through hole 322 formed on the radiator 3, and a second via hole 12 formed on the circuit board 1. The pre-tightening device 4 further includes a mounting member 41 passing through the second through hole 322 and the second via hole 12. Therefore, the positioning effect can be realized through the engagement of the mounting member 41 into the second through hole 322 and the second via hole 12, thereby eliminating the additional positioning step, which in turn improves the assembly efficiency and reduces the assembly difficulty.

As illustrated in FIG. 1, the pre-tightening device 4 includes the spring member 42. The spring member 42 is sleeved over the mounting member 41. The mounting member 41 is configured to provide the spring member 42 with the reaction force to allow the spring member 42 to clamp the radiator 3 and the circuit board 1 through the elastic force. Therefore, the mounting member 41 can on the one hand position the radiator 3 and the circuit board 1, and on the other hand limit the spring member 42. Further, the mounting member 41 can provide the spring member 42 with the reaction force. Therefore, the pre-tightening device 4 has a simple structure and low cost, and is easy to be processed and assembled. For example, the mounting member 41 includes a third support point located at the side of the radiator 3 away from the circuit board 1 and a fourth support point located at the side of the circuit board 1 away from the radiator 3. An elastic member is disposed between the third support point and the radiator 3, and/or the spring member 42 is disposed between the fourth support point and the circuit board 1. Thus, the spring member 42 can apply a pressure to the radiator 3 and/or the circuit board 1 under the reaction force provided at the third support point and the fourth support point to tightly press the radiator 3 and the chip 2 against each other.

Therefore, during operation, the circuit board 1 and the radiator 3 are rigidly connected to each other by means of the fixing member 5, rather than being elastically connected to each other by means of the spring member 42. Therefore, when the electric control component 100 is applied in the vibration environment, the heat dissipation reliability of the electric control component 100 in the vibration application environment can be improved since the radiator 3 and the chip 2 can maintain in the reliable tight pressed state by the fixing member 5.

Moreover, with the electric control component 100 according to the embodiments of the present disclosure, during the assembling, since the radiator 3 and the chip 2 can be first tightly pressed against each other by means of the spring member 42, and the radiator 3 and the circuit board 1 are then rigidly connected to each other by means of the fixing member 5, it is possible to ensure that the radiator 3 and the chip 2 are in the tight pressed state reliably. That is, the rigid connection is implemented in the case where it is ensured that the radiator 3 and the chip 2 are in the tight pressed state. Thus, it is possible to simply and effectively ensure that the radiator 3 and the chip 2 can still be in the tight pressed state after the radiator 3 and the circuit board 1 are rigidly connected to each other, thereby effectively ensuring the heat dissipation reliability of the radiator 3. Further, by clamping the radiator 3 and the circuit board 1 by means of the spring member 42, it is possible to effectively enhance compatibility and reduce processing difficulty.

Therefore, in the electric control component 100 according to the embodiments of the present disclosure, by providing the pre-tightening device 4 and the fixing member 5, it is possible for the circuit board 1 and the radiator 3 to automatically adjust clamping effect in a predetermined space by means of the spring member 42. Then, the circuit board 1 and the radiator 3 are rigidly connected to each other by means of the fixing member 5. Thus, it is possible to ensure that no relative movement is generated between the circuit board 1 and the radiator 3. Therefore, the electric control component 100 can be applied in a static application scenario, and would not be affected by factors such as vibration in a dynamic application scenario, thereby ensuring that the radiator 3 can reliably dissipate heat from the chip 2. Moreover, after the fixing by means of the fixing member 5, it is possible to avoid generation of an assembly gap between the chip 2 and the radiator 3 caused by deformation or failure of the spring member 42 due to long-term load, which may affect heat dissipation effect.

In some embodiments of the present disclosure, the chip 2 is an intelligent power module (IPM) with a patch disposed on the circuit board 1. Therefore, with the electric control component 100 according to the embodiments of the present disclosure, the heat from the intelligent power module can be reliably dissipated through the radiator 3.

In the related art, for the circuit board provided with the intelligent power module, the radiator cannot be fixed by means of screws. Thus, an elastic snap is generally provided on the circuit board to fix the radiator on the circuit board.

However, in this method, since intelligent power modules of different specifications have different dimensions such as different sizes and thicknesses, the elastic snap or the radiator is required to be re-customized according to specific situations and has poor compatibility. In addition, such assembling method places high demands on processing precision. When the processing precision of the elastic snap is not up to standard, an assembly gap would be generated between the radiator and the intelligent power module. As a result, heat dissipation reliability can be affected. Further, production and assembly effect cannot be ensured and it is time-consuming.

However, in the electric control component 100 according to the embodiments of the present disclosure, by providing the pre-tightening device 4 and the fixing member 5, before the circuit board 1 and the radiator 3 are rigidly connected to each other by means of the fixing member 5, the intelligent power modules of different specifications can be first automatically adjusted by means of the pre-tightening device 4 to achieve self-adaption of the intelligent power modules of different specifications to the radiator 3. As a result, it is possible to allow the radiator 3 and the intelligent power module to be pressed tightly against each other, thereby avoiding the generation of the assembly gap and ensuring the heat dissipation effect without re-customizing the elastic snap or the radiator 3 and requiring the processing precision and assembly precision of the elastic snap. Thus, the compatibility is good, which in turn reduces a demand for production process a great extent. Further, the processing precision, the assembly difficulty, and the manufacturing cost can be reduced while improving the manufacturing efficiency.

In the electric control component 100 according to the embodiments of the present disclosure, by the elastic connection by means of the pre-tightening device 4 and the rigid connection by means of the fixing member 5, i.e., the elastic connection is first realized by means of the tight pressing of the pre-tightening device 4, and then the rigid and fixed connection is realized by manes of the fixing member 5, the compatibility can be effectively improved in the present disclosure. In addition, it is possible to ensure the tight pressing effect and heat dissipation effect of the chip 2 and the radiator 3. Moreover, the compatibility with intelligent power modules of different thicknesses can be improved to allow the radiator 3 and the intelligent power modules of different thicknesses to be tightly pressed against each other effectively.

However, it should be noted that, in the electric control component 100 according to the embodiments of the present disclosure, the chip 2 is not limited to the intelligent power module. That is, for all other chips 2 to be heat dissipated, the mounting of the radiator 3 may be implemented by using the method disclosed in the present disclosure.

Figure 2:
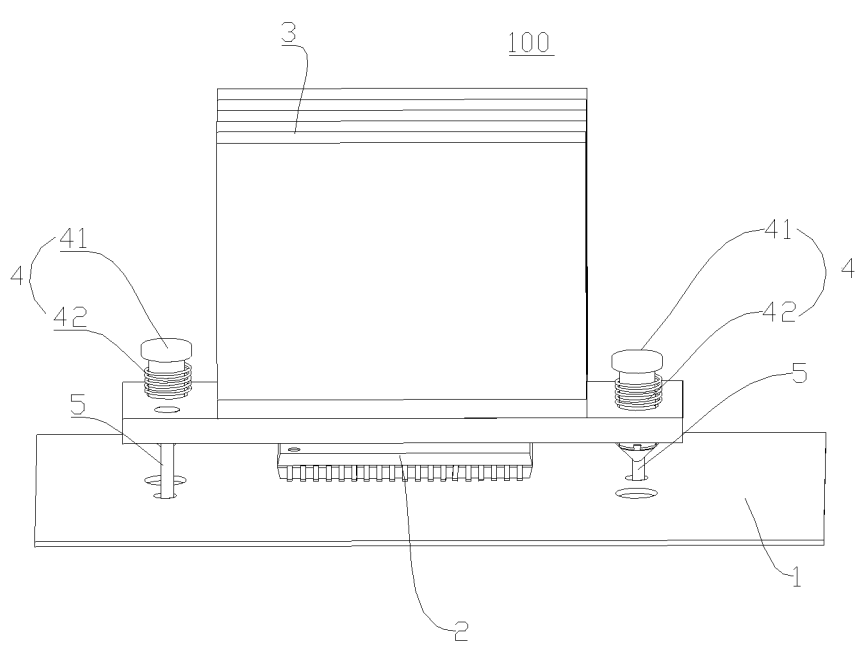
FIG. 2 is an assembled state view of the electric control component illustrated in FIG. 1.
Figure 4:
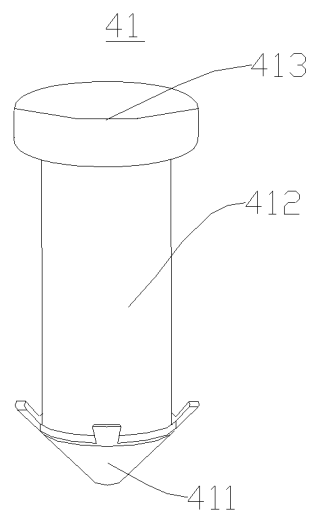
FIG. 4 is a perspective view of a mounting member illustrated in FIG. 1.

In some embodiments of the present disclosure, as illustrated in FIG. 4, the mounting member 41 includes a first abutting portion 411, a penetrating portion 412, and a second abutting portion 413. As illustrated in FIG. 1 and FIG. 2, the penetrating portion 412 penetrates the circuit board 1 and the radiator 3. That is, the second through hole 322 is formed on the radiator 3, and the second via hole 12 is formed on the circuit board 1. The penetrating portion 412 passes through the second through hole 322 and the second via hole 12. In this way, the mounting member 41 can limit the radiator 3 and the circuit board 1 in a thickness direction perpendicular to the circuit board 1. In this way, it is possible to prevent the circuit board 1 from separating from the radiator 3 in the thickness direction perpendicular to the circuit board 1.

Further, it is possible to avoid the mounting member 41 from being disengaged from the circuit board 1 and the radiator 3 in the thickness direction perpendicular to the circuit board 1.

As illustrated in FIG. 1 and FIG. 2, the first abutting portion 411 is connected to the penetrating portion 412 and is limited on the side of the circuit board 1 away from the radiator 3. The second abutting portion 413 is connected to the penetrating portion 412 and is limited on the side of the radiator 3 away from the circuit board 1. Therefore, by providing the first abutting portion 411 and the second abutting portion 413, it is possible to prevent the mounting member 41 from being disengaged from the circuit board 1 and the radiator 3 in the thickness direction of the circuit board 1 and provide the spring member 42 with the reaction force.

As illustrated in FIG. 1 and FIG. 2, the spring member 42 is sleeved over the penetrating portion 412, thereby avoiding disengagement of the spring member 42 from the mounting member 41. Moreover, the spring member 42 is disposed between the first abutting portion 411 and the circuit board 1 and/or between the second abutting portion 413 and the radiator 3. That is, the spring member 42 may be disposed between the first abutting portion 411 and the circuit board 1 (in this case, the spring member 42 has a smaller sectional area than the first abutting portion 411), and the spring member 42 may be disposed between the second abutting portion 413 and the radiator 3 (in this case, the spring member 42 has a smaller sectional area than the second abutting portion 413). Therefore, it is possible for the spring member 42 to tightly press the radiator 3 and the chip 2 against each other. Therefore, the mounting member 41 has a simple structure, and can reliably tightly press the radiator 3 and the chip 2 against each other.

It should be noted that the penetrating portion 412 may be formed into one piece, or may be formed by connecting a plurality of separate pieces. For example, the penetrating portion 412 may be formed by threading an external-threaded rod into an internal-threaded sleeve. In addition, the first abutting portion 411 and the penetrating portion 412 may be formed into one piece, or may be separate pieces. For example, the penetrating portion 412 and the first abutting portion 411 may be fixed to each other through threaded connection. In addition, the second abutting portion 413 and the penetrating portion 412 may be formed into one piece, or may be separate pieces. For example, the penetrating portion 412 and the second abutting portion 413 may be fixed to each other through threaded connection.

In some embodiments of the present disclosure, as illustrated in FIG. 4, the first abutting portion 411 is a first elastic snap. The first elastic snap passes through the second via hole 12 on the circuit board 1 through elastic compression, and is limited on the side of the circuit board 1 away from the radiator 3 through an elastic restoring force. Therefore, the assembly of the mounting member 41 and the circuit board 1 can be simply, quickly, and effectively realized through elastic deformation of the first elastic snap.

For example, in an example illustrated in FIG. 4, the first elastic snap may include a plurality of elastic sheets. Before deformation, the plurality of elastic sheets extends away from the penetrating portion 412 in a direction from the first abutting portion 411 to the second abutting portion 413. When the first abutting portion 411 is inserted into the second via hole 12 in a direction from the second abutting portion 413 to the first abutting portion 411, the plurality of elastic sheets is compressed by the second via hole 12 to deform towards the penetrating portion 412. In this case, it is possible to allow the first elastic snap to passes through the second via hole 12. After the first elastic snap passes through the second via hole 12, the elastic sheets restore to its original shape and abut against the side of the circuit board 1 away from the radiator 3 to be limited. In this way, it is possible to avoid disengagement of the mounting member 41 in a direction from the circuit board 1 to the radiator 3.

In some embodiments of the present disclosure, the second abutting portion 413 is a second elastic snap. The second elastic snap passes through the second through hole 322 on the radiator 3 through the elastic compression, and is limited on the side of the radiator 3 away from the circuit board 1 through the elastic restoring force. Therefore, the assembly of the mounting member 41 and the circuit board 1 can be simply, quickly, and effectively realized through elastic deformation of the second elastic snap. The second elastic snap may have the same form as the first elastic snap described above, and thus details thereof will be omitted herein.

In some embodiments of the present disclosure, for the mounting member 41, only the first abutting portion 411 may be the first elastic snap, and the second abutting portion 413 may be of other structures for abutment, such as a baffle-shaped or flat-post-shaped structure; or for the mounting member 41, the second abutting portion 413 may be the second elastic snap, and the first abutting portion 411 may be of other structures for abutment, such as a baffle-shaped or flat-post-shaped structure; or for the mounting member 41, the first abutting portion 411 may be the first elastic sap, and the second abutting portion 413 may be the second elastic snap. The mounting can be realized by all of the above implementations.

In some embodiments of the present disclosure, regardless the first abutting portion 411 is the first elastic snap or the second abutting portion 413 is the second elastic snap, the mounting member 41 may be formed into one piece, which can reduce the processing difficulty and improve the assembly efficiency. For example, in some examples, the mounting member 41 may be made of corrosion-free and high-temperature-resistant materials such as nylon.

In an example illustrated in FIG. 4, the mounting member 41 is formed into one piece. The first abutting portion 411 is the first elastic snap. The second abutting portion 413 is a flat post. The penetrating portion 412 is an elongate post. A diameter of the second through hole 322 is greater than a diameter of the penetrating portion 412 and smaller than a diameter of the second abutting portion 413. A diameter of the spring member 42 is greater than the diameter of the penetrating portion 412 and smaller than the diameter of the second abutting portion 413. Therefore, it is possible to avoid automatic disengagement of the mounting member 41 form the spring member 42 after the assembly, thereby tightly pressing the radiator 3 and the chip 2 against each other.

As illustrated in FIG. 1, the first through hole 321 and the second through hole 322 are formed on the radiator 3. The first through hole 321 is configured to be engaged with the fixing member 5. For example, the first through hole 321 is configured to allow the fixing member 5 to pass therethrough. The second through hole 322 is configured to be engaged with the pre-tightening device 4. For example, the second through hole 322 is configured to allow the penetrating portion 412 to pass therethrough. The first through hole 321 has a diameter that is unequal to that of the second through hole 322. Therefore, an anti-stay effect can be realized, and the assembly efficiency can be improved.

In some embodiments of the present disclosure, the fixing member 5 is soldered to the circuit board 1. Therefore, the rigid connection between the fixing member 5 and the circuit board 1 can be simply and effectively achieved, and the reliability of the rigid connection between the fixing member 5 and the circuit board 1 can be improved. However, the present disclosure is not limited, in this regard. In other embodiments of the present disclosure, the fixing member 5 may also be rigidly connected to the circuit board 1 in other manners such as through integral formation, threaded connection, riveting.

In some examples of the present disclosure, when the fixing member 5 is soldered to the circuit board 1, wave soldering may be employed. In some embodiments, the fixing member 5 may be made of a metal material and have a surface at least partially plated with tin. During the wave soldering, a solder is sprayed at an engagement position of the fixing member 5 with the circuit board 1, and the solder is ensured to reliably fix the fixing member 5 and the circuit board 1 by a tin plating layer on the surface of the fixing member 5. In addition, for the circuit board 1 provided with the intelligent power module, in the existing processing steps, the wave soldering is required for the circuit board 1 itself to solder the fixing member 5, which can save processing steps and improve the production efficiency. However, the present disclosure is not limited, in this regard. The surface of the fixing member 5 may also not be plated with tin. In this case, the fixing member 5 may be wholly made of a material suitable for soldering, such as tin.

In addition, in order to improve soldering reliability, as illustrated in FIG. 1 and FIG. 2, the first via hole 11 may be formed on the circuit board 1, and a part of the fixing member 5 may pass through the first via hole 11. The solder is sprayed into an engagement gap between the first via hole 11 and the fixing member 5 during the wave soldering, thereby achieving reliable soldering between the fixing member 5 and the circuit board 1. However, the present disclosure is not limited to, in this regard. The fixing member 5 may also not perpetrate the circuit board 1. Further, the fixing member 5 may also be soldered to the circuit board 1 in other soldering manners than the wave soldering, and details thereof will be omitted herein.

In some embodiments of the present disclosure, as illustrated in FIG. 1 and FIG. 2, the fixing member 5 is riveted to the radiator 3. Therefore, the rigid connection between the fixing member 5 and the radiator 3 can be simply and effectively achieved, and the reliability of the rigid connection between the fixing member 5 and the radiator 3 can be improved. However, the present disclosure is not limited, in this regard. In other embodiments of the present disclosure, the fixing member 5 may also be rigidly connected to the radiator 3 in other manners such as through an integral formation, threaded connection, soldering.

In some embodiments of the present disclosure, as illustrated in FIG. 1 and FIG. 2, the fixing member 5 on the one hand is soldered to the circuit board 1, and on the other hand is riveted to the radiator 3. Therefore, the circuit board 1 and the radiator 3 can be rigidly connected to each other by means of the fixing member 5 simply and effectively. Further, it is possible to ensure that the material of each of the fixing member 5, the circuit board 1, and the radiator 3 can satisfy respective requirements. For example, in an example of this embodiment, the fixing member 5 may be made of the metal material and has a tin-plated surface. During the assembly, the pre-tightening device 4 is assembled first, and then the fixing member 5 riveted to the radiator 3 is soldered and fixed to the circuit board 1 through the wave soldering. Thus, it is possible to achieve the elastically rigid connection between the radiator 3 and the circuit board 1.

In addition, in the related art, when the intelligent power module is applied in the application scenario having great vibration such as an outdoor unit of an air conditioner, if the above elastic snap is employed for the fixing, since the elastic snap is easily broken due to vibration, there is a risk of a failure of the fixing of the radiator. In the electric control component 100 according to the embodiments of the present disclosure, since the circuit board 1 and the radiator 3 are rigidly connected to each other by means of the riveted and soldered fixing member 5, it is possible to avoid generation of an assembly gap between the radiator 3 and the intelligent power module caused by deformation or breakage of the elastic snap due to long-term load when the elastic snap is used alone. That is, reliability of tight pressing between the radiator 3 and the intelligent power module as well as the heat dissipation reliability can be improved.

For example, in the electric control component 100 according to the embodiments of the present disclosure, when the riveted and soldered fixing member 5 is employed, it is determined whether the electric control component 100 satisfies an electric control panel vibration test at 35 Grms. The test result is not lower than the screw fixing manner. As a result, the electric control component 100 according to the embodiments of the present disclosure can be applied in severe vibration conditions. The Grms refers to an effective vibration acceleration value which represents an acceleration root-mean-square value from a frequency of 2 Hz to a frequency of 2000 Hz.

In addition, it should be noted that, according to the embodiments of the present disclosure, the elastic force of the spring member 42 is not limited herein. For example, a spring of an elastic force greater than 120 g/mm may be selected to ensure reliably implement the assembly through sufficient elastic force. In addition, it should be noted that the embodiment of the present disclosure is not limited to a specific type of the spring member 42. For example, the spring member 42 may be a cylindrical spring, a butterfly spring, and the like, and details thereof will be omitted herein.

Figure 3:
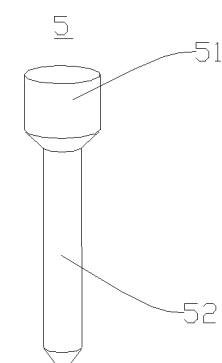
FIG. 3 is a perspective view of a fixing member illustrated in FIG. 1.

In some embodiments of the present disclosure, as illustrated in FIG. 3, the fixing member 5 has a head portion 51 and a rod portion 52. The first through hole 321 is formed on the radiator 3. With reference to FIG. 1, the first via hole 11 is formed on the circuit board 1, the head portion 51 is riveted into the first through hole 321, and the rod portion 52 passes through the first via hole 11 and is soldered into the first via hole 11. Therefore, the fixing member 5 is simple in structure and easy to be processed, which facilitates the riveting to the radiator 3 and the soldering to the circuit board 1. Further, there is no impact on the tight pressing between the radiator 3 and the chip 2.

In some examples, the head portion 51 and the first through hole 321 are adapted to each other in shape and have an equal size to achieve the riveting. The rod portion 52 has a cross-sectional area slightly smaller than that of the first via hole 11 to allow for a clearance fit between the rod portion 52 and the first via hole 11 when the rod portion 52 passes through the first via hole 11. For example, a gap between the rod portion 52 and the first via hole 11 may range from 0.15 mm to 0.2 mm, or from 0.3 mm to 0.4 mm. In this way, it is possible to additionally provide the solder to the gap between the rod portion 52 and the first via hole 11 to implement the soldering.

In addition, in order to achieve the soldering, the rod portion 52 may be made of a metal material and has a surface plated with tin to enable the soldering through the wave soldering and reliably soldering to the circuit board 1, or the fixing member 5 may be made of a solderable material. In addition, a height of the fixing member 5 is design in such a manner that the rod portion 52 is long enough to be inserted and engaged into the first via hole 11.

As illustrated in FIG. 3, a plane perpendicular to an axis of the rod portion 52 is defined as a projection plane. A projection area of the head portion 51 on the projection plane is greater than a projection area of the rod portion 52 on the projection plane, and the projection area of the head portion 51 on the projection plane is greater than a projection area of the first via hole 11 on the projection plane. Therefore, it is possible to ensure that the solder has a sufficient thickness by satisfying the riveting reliability by means of the head portion 51 with a greater sectional area and by ensuring the solder is not wasted by means of the rod portion 52 with a smaller sectional area, while saving the cost, thereby ensuring the soldering reliability.

For example, when each of the head portion 51, the rod portion 52, and the first via hole 11 has a circular cross section, the head portion 51 has a diameter greater than a diameter of the rod portion 52, the diameter of the head portion 51 is also greater than a diameter of the first via hole 11. However, the present disclosure is not limited, in this regard. Each of the head portion 51, the rod portion 52, and the first via hole 11 may also have a cross section of other shapes such as a polygon or special shape, and details thereof will be omitted herein.

In some embodiments of the present disclosure, when a cross-sectional area of the head portion 51 is greater than a cross-sectional area of the rod portion 52, a height of the rod portion 52 may be greater than a depth of the first through hole 321 on the radiator 3 to enable the rod portion 52 to be positioned and engaged into the first via hole 11 before the head portion 51 is riveted. Therefore, during the assembling, when the fixing member 5 is riveted to the radiator 3 after the pre-tightening device 4 has been mounted, an assembling direction of the fixing member 5 can be restricted by the cross-sectional area of the head portion 51 being greater than the cross-sectional area of the rod portion 52. That is, it is necessary for the fixing member 5 to be assembled in a direction from the radiator 3 to the circuit board 1 to allow the rod portion 52 to sequentially pass through the first through hole 321 and the first via hole 11. In addition, the head portion 51 is easily riveted into the first through hole 321 by means of the engagement of the rod portion 52 into the first via hole 11. Further, during the riveting, the head portion 51 abuts against a side surface of the circuit board 1 close to the radiator 3 to avoid over-riveting.

However, the present disclosure is not limited, in this regard. In other embodiments of the present disclosure, the fixing member 5 may be first riveted to the radiator 3, then the pre-tightening device 4 is assembled, and the fixing member 5 and the circuit board 1 are then soldered to each other, and details thereof will be omitted herein.

In some embodiments of the present disclosure, as illustrated in FIG. 3, a cross-sectional area of an end of the rod portion 52 away from the head portion 51 may be gradually decreased in a direction away from the head portion 51, and a cross-sectional area of an end of the head portion 51 close to the rod portion 52 may be gradually decreased in a direction from the head portion 51 to the rod portion 52. For example, with reference to FIG. 3, each of a lower end of the rod portion 52 and a lower end of the head portion 51 may be of a conical shape, thereby reducing the assembly difficulty and improving the assembly efficiency.

In the examples illustrated in FIG. 1 and FIG. 3, the fixing member 5 may only be composed of two segments including the head portion 51 serving as an upper segment and the rod portion 52 serving as a lower segment. Therefore, the fixing member 5 is simple in structure and easy to be processed. In addition, the present disclosure is not limited, in this regard. In other embodiments of the present disclosure, the cross-sectional area of the head portion 51 of the fixing member 5 may also be greater than the diameter of the first through hole 321. In this case, the head portion 51 abuts against the side of the radiator 3 away from the circuit board 1. Meanwhile, it is also possible to achieve the rigid connection between the circuit board 1 and the radiator 3 by means of the soldering between the rod portion 52 and the circuit board 1.

Figure 5:
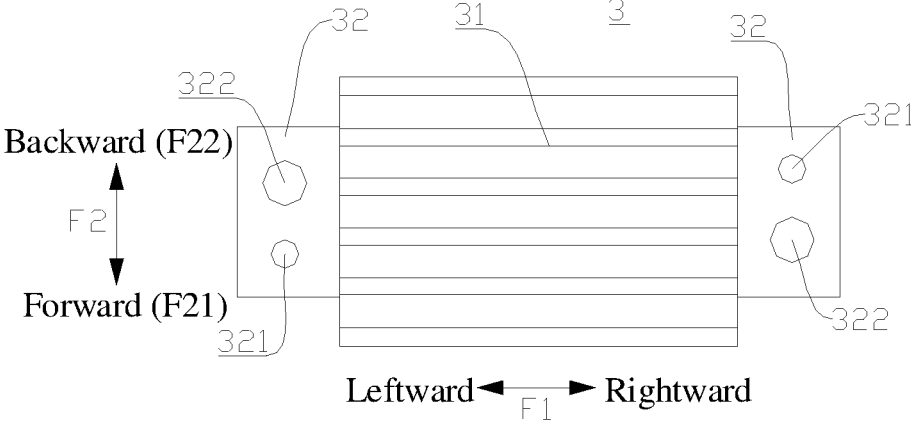
FIG. 5 is a top view of a radiator illustrated in FIG. 1.
Figures 6, 7:
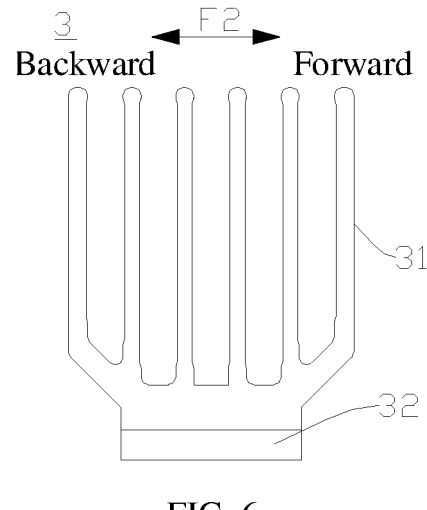
FIG. 6 is a left view of a radiator illustrated in FIG. 1.
FIG. 7 is a schematic view of an air conditioner according to an embodiment of the present disclosure.

In some embodiments of the present disclosure, as illustrated in FIG. 1, FIG. 5, and FIG. 6, the radiator 3 includes a body portion 31 and two connection portions 32. The two connection portions 32 are disposed on two sides of the body portion 31 in a first direction F1. Each of the two connection portions 32 is connected to the pre-tightening device 4 and the fixing member 5. Therefore, the radiator 3 and the chip 2 can be pressed tightly against each other at both sides in the first direction F1. In this way, automatic adjustment of the tight pressing effect can be realized at both sides. As a result, it is possible to avoid a problem in which the tight pressing is created at one side and upwarp occurs at the other side in the first direction F1, thereby further improving the tight pressing and attachment effect between the radiator 3 and the chip 2.

In some embodiments of the present disclosure, as illustrated in FIG. 1 and FIG. 5, the pre-tightening device 4 and the fixing member 5 on each of the two connection portions 32 are spaced apart from each other in a second direction F2. The second direction F2 intersects with the first direction F1. That is, the second direction F2 intersects with the first direction F1 at an acute angle, an obtuse angle, or a right angle. Therefore, the overall tight pressing and attachment effect between the radiator 3 and the chip 2 in the first direction F1 and the second direction F2 can be further improved while ensuring structural compactness.

In some embodiments of the present disclosure, two sides of the electric control component 100 in the second direction F2 are a first side F21 and a second side F22, respectively. The pre-tightening device 4 on one of the two connection portions 32 is located at the first side F21 relative to the fixing member 5, and the pre-tightening device 4 on the other one of the two connection portions 32 is located at the second side F22 relative to the fixing member 5. As a result, the tight pressing can be implemented at two diagonal sides. Therefore, it is possible to avoid the problem in which the tight pressing is created at one side and upwarp occurs at the other side in the first direction F1. Thus, an elastically tight pressing can be realized at one of the two diagonal sides, and the rigid fixing can be realized at the other one of the two diagonal sides, thereby ensuring the tight pressing and fixing effect.

For example, in the examples illustrated in FIG. 1 and FIG. 5, two fixing members 5 may be centrally symmetrical about a center of the radiator 3, and two pre-tightening devices 4 may be centrally symmetrical about the center of the radiator 3. In other words, the pre-tightening device 4 and the fixing member 5 on each of the two connection portions 32 are formed into one group. The two groups are centrally symmetrical about the center of the radiator 3 and distributed at diagonal corners on both sides of the radiator 3, thereby ensuring the reliability of the elastically tight pressing and the reliability of the rigid connection. In a case where any one of the chip 2 or the radiator 3 is inclined or uneven, the inclined or uneven component can freely return back into its original position by means of the spring member 42. That is, when the above inclination occurs during the assembling, the spring member 42 can push the radiator 3 or the circuit board 1 to return back into its original position with the elastic force, thereby enabling the radiator 3 and the chip 2 to be tightly pressed against each other. Thus, the reliability of the heat dissipation can be ensured.

For example, in the example illustrated in FIG. 5, the connection portion is disposed on both sides of the body portion 31 of the radiator 3 in a leftward-and-rightward direction. The first through hole 321 and the second through hole 322 are formed on each of the connection portions, and are spaced apart from each other in a forward-and-backward direction. The first through hole 321 on the left connection portion 32 is located at a front side of the second through hole 322. The first through hole 321 on the right connection portion 32 is located at a rear side of the second through hole 322. The diameter of the first through hole 321 is smaller than the diameter of the second through hole 322. The left first through hole 321 and the right first through hole 321 are located at diagonal positions on the left and right sides of the radiator 3 and are centrally symmetrically distributed about the center of the radiator 3. The left second through hole 322 and the right second through hole 322 are located at diagonal positions on the left and right sides of the radiator 3 and are centrally symmetrically distributed about the center of the radiator 3.

A connection line between a center of the left first through hole 321 and a center of the second through hole 322 on the left side is parallel to a left edge of the left connection portion 32. A connection line between a center of the first through hole 321 and a center of the second through hole 322 on the right side is parallel to a right edge of the right connection portion 32. The first through hole 321 is configured to allow the fixing member 5 to pass therethrough. For example, the head portion 51 of the fixing member 5 is riveted into the first through hole 321. The second through hole 322 is configured to allow the penetrating portion 412 to pass therethrough. A minimum distance between each of the first through hole 321 and the second through hole 322 and the corresponding edge of the corresponding connection portion 32 is greater than or equal to 2 mm. In this way, it is possible to ensure structural reliability of the connection portion 32. Further, it is possible to ensure that the pre-tightening device 4 and the fixing member 5 can function reliably.

In the electric control component 100 according to at least one embodiments of the present disclosure, by providing the pre-tightening device 4 and the fixing member 5, the assembling manner is changed into the combination of the elastic connection and the rigid connection. After the mounting member 41 is assembled, the tight pressing is adjusted in a contact region between the radiator 3 and the chip 2 by means of the spring member 42 to enable at least one of the radiator 3 and the chip 2 to freely return back into its original position. Then, the fixing member 5 and the circuit board 1 are fixed to each other with the soldering through the wave soldering. After the soldering, the rigid connection by the spring can be implemented by means of the fixing members 5 that are centrally symmetric and distributed diagonally. In this case, the pre-tightening device 4 may be in on operation.

Therefore, it is possible to eliminate the influence of the deformation and failure of the pre-tightening device 4 on the assembly effect due to the long-term operation of a mechanical member, and the application of the elastic connection are not restricted. In addition, it is possible to satisfy the requirement of no assembling looseness and failure when an outdoor unit of an air conditioner is vibrated at 35 Grms after the soldering and the fixing.

In some embodiments of the present disclosure, as illustrated in FIG. 1 and FIG. 5, a side surface of the connection portion 32 facing towards the circuit board 1 and a side surface of the body portion 31 facing towards the circuit board 1 may be the same surface, and a side surface of the connection portion 32 away from the circuit board 1 is located at a side, close to the circuit board 1, of a side surface of the body portion 31 away from the circuit board 1. In this way, it is easy for processing, and both a height of the pre-tightening device 4 and a height of the fixing member 5 can be shortened while ensuring the clamping of the radiator 3 and the chip 2. Further, the cost can be lowered and the connection stability can be improved.

In addition, it should be noted that the specific construction of the radiator 3 is not limited herein. For example, in some embodiments, the connection portion 32 and the body portion 31 may be formed into one piece. For example, in other embodiments, the connection portion 32 and the body portion 31 may also be separate pieces and are connected to each other by welding. In some examples, when the connection portion 32 is welded to the body portion 31, two connection portions 32 may be provided and are welded onto two sides of the body portion 31, respectively. In other examples, the radiator 3 may further include a bottom support portion. The two connection portions 32 are located on two sides of the bottom support portion, respectively. The two connection portions 32 and the bottom support portion are formed into one piece, a top surface of the bottom support portion is welded to a bottom surface of the body portion 31, and the like.

In some embodiments of the present disclosure, a thermally conductive member 6 is disposed between the radiator 3 and the chip 2, thereby improving the heat dissipation effect of the chip 2 by the radiator 3. It should be noted that specific material selection and position setting of the thermally conductive member 6 are not limited herein. For example, the thermally conductive member 6 may be a thermally conductive pad, a thermally conductive silicone grease, or the like. When the thermally conductive member 6 is the thermally conductive pad, the thermally conductive pad may be pre-fixed to the radiator 3, and is sandwiched between the radiator 3 and the chip 2 when the radiator 3 is assembled with the circuit board 1. In addition, when the thermally conductive member 6 is the thermally conductive silicone grease, the thermally conductive silicone grease is coated on at least one of the radiator 3 and the chip 2, and is sandwiched between the radiator 3 and the chip 2 when the radiator 3 is assembled to with circuit board 1.

In another embodiment, this embodiment is substantially same as the above embodiment expect a difference that mainly lies in that after the radiator 3 is rigidly connected to the circuit board 1 by means of the fixing member 5, the pre-tightening device 4 needs to be removed to enable the electric control component 100 as the product not to contain the pre-tightening device 4. Some specific schemes of this embodiment will be only described below, and it is conceivable for those skilled in the art that the different schemes of the above embodiments can be combined without contradicting each other. For example, in this embodiment, reference may be made to the chip 2, the fixing member 5, the thermally conductive member 6 as described in the above embodiments, and details thereof will be omitted herein for brevity.

In some examples of this embodiment, as illustrated in FIG. 1, the engagement portion M may include a second through hole 322 and a second via hole 12. The second through hole 322 is formed on the radiator 3, and the second via hole 12 is formed on the circuit board 1. Therefore, positioning of the radiator 3 and the circuit board 1 in a plane perpendicular to the clamping direction can be realized with the engagement between the second through hole 322 and the pre-tightening device 4 and the engagement between the second via hole 12 and the pre-tightening device 4. Thus, it is possible to eliminate the additional positioning steps, which in turn improves the assembly efficiency and reduces the assembly difficulty.

In some examples of this embodiment, as illustrated in FIG. 1 and FIG. 5, the radiator 3 includes a body portion 31 and two connection portions 32. The two connection portions 32 are disposed on two sides of the body portion 31 in the first direction F1. The second through hole 322 is formed on each of the two connection portions 32. Therefore, the radiator 3 and the chip 2 can be pressed tightly against each other at both sides in the first direction F1. As a result, the automatic adjustment of tight pressing effects at both two sides can be realized. Therefore, it is possible to avoid the problem in which the tight pressing is created at one side and upwarp occurs at the other side in the first direction F1, thereby further improving the tight pressing and attachment effect between the radiator 3 and the chip 2.

In some examples of this embodiment, as illustrated in FIG. 5, a first through hole 321 is formed on each of the two connection portions 32. The fixing member 5 is engaged into the first through hole 321. The second through hole 322 is spaced apart from the first through hole 321 in a second direction F2. That second direction F2 intersects with the first direction F1. That is, the second direction F2 intersects with the first direction F1 at an acute angle, an obtuse angle, or a right angle. Therefore, the overall tight pressing and attachment effect between the radiator 3 and the chip 2 in the first direction F1 and the second direction F2 can be further improved while ensuring structural compactness.

In some examples of this embodiment, two sides of the electric control component 100 in the second direction F2 are a first side F21 and a second side F22, respectively. The second through hole 322 on one of the two connection portions 32 is located at the first side F21 relative to the first through hole 321, and the first through hole 321 on the other one of the two connection portions 32 is located at the second side F22 relative to the second through hole 322. Therefore, the tight pressing can be implemented at two diagonal sides. As a result, it is possible to avoid the problem in which the tight pressing is created at one side and upwarp occurs at the other side in the first direction F1. Thus, an elastically tight pressing can be realized at one of the two diagonal sides, and the rigid fixing can be realized at the other one of the two diagonal sides, thereby ensuring the tight pressing and fixing effect.

In some examples of this embodiment, as shown in FIG. 5, the first through hole 321 has a diameter that is unequal to that of the second through hole 322. Therefore, it is possible to achieve an anti-stay effect and avoid incorrect assembling position of the pre-tightening device 4 and the fixing member 5, thereby improving the assembly efficiency.

An assembly method for an electric control component according to an embodiment of the present disclosure will be described below with reference to the drawings.

In this embodiment, the electric control component 100 includes a circuit board 1, a chip 2, and a radiator 3. The chip 2 is disposed on the circuit board 1. The radiator 3 is disposed at a side of the chip 2 away from the circuit board 1. The assembly method includes: clamping the radiator 3 and the circuit board 1 by means of a pre-tightening device 4; and connecting the radiator 3 to the circuit board 1 rigidly by means of a fixing member 5.

Therefore, with the above steps, the circuit board 1 and the radiator 3 can automatically adjust the clamping effect in a predetermined space by means of the spring member 42. Then, the circuit board 1 and the radiator 3 are rigidly connected to each other by means of the fixing member 5. Therefore, the electric control component 100 can be applied in a static application scenario, and would not be affected by factors such as vibration in a dynamic application scenario, thereby ensuring that the radiator 3 can reliably dissipate heat from the chip 2. Moreover, after the fixing by means of the fixing member 5, it is possible to avoid generation of an assembly gap between the chip 2 and the radiator 3 caused by deformation or failure of the pre-tightening device 4 due to long-term load, which may affect heat dissipation effect.

It should be noted that, in this embodiment, at least one of the circuit board 1 and the radiator 3 may have or not have the engagement portion M as described above. In this case, an external clamp may be employed as the prefabricated component (such as, the pre-tightening device 4) to clamp the radiator 3 and the circuit board 1.

In the assembly method according to some embodiments of the present disclosure, after the radiator 3 is rigidly connected to the circuit board 1 by means of the fixing member 5, the pre-tightening device 4 (which can be in the form of an assembly) may be removed or remained as required. For example, when the prefabricated assembly 4 is the external clamp as described above, the prefabricated assembly 4 may be removed. When the prefabricated assembly 4 includes the mounting member 41 and the spring member 42 as described above, the mounting member 41 may be cut off to remove the spring member 42, or the mounting member 41 and the spring member 42 may be remained in the electric control component 100. Therefore, the electric control component 100 can be obtained by selecting a suitable assembly method based on different actual requirements.

Hereinafter, an air conditioner 1000 according to an embodiment of the present disclosure will be described below with reference to the drawings.

As illustrated in FIG. 7, the air conditioner 1000 includes a plurality of power-consumption operation components 200 and the electric control component 100 according to any one of the above embodiments of the present disclosure. The electric control component 100 is electrically connected to at least one of the plurality of power-consumption operation components 200. Therefore, for the application scenario in which vibration occurs during the operation of the air conditioner 1000, since the chip 2 and the radiator 3 can be reliably pressed tightly against each other and dissipate heat, the reliability of the electric control component 100 can be improved, thereby ensuring the operating reliability of the air conditioner 1000.

It should be noted that, the specific construction of the air conditioner 1000 is well-known to those skilled in the art. For example, the air conditioner 1000 may include a compressor component, a condenser, an evaporator, a throttling device, a fan component, an air deflection component, and the like. These components that require a power supply to operate such as the compressor component and the fan component are all power-consumption operation components 200. The electric control component 100 according to the embodiments of the present disclosure may be connected to the at least one of the plurality of power-consumption operation components 200.

In addition, it should be noted that the specific type of the air conditioner 1000 is not limited to the embodiments of the present disclosure. For example, the air conditioner 1000 may be a split machine or an all-in-one machine. When the air conditioner 1000 is the split machine, the air conditioner 1000 may include an indoor unit 1A and an outdoor unit 1B, and the electric control component 100 is disposed within the outdoor unit 1B. Since the power-consumption operation component 200 in the outdoor unit 1B has a relatively large load and a large operating current, control may be implemented by means of the intelligent power module. Operating reliability of the outdoor unit 1B can be improved by using the electric control component 100 according to the embodiments of the present disclosure. When the air conditioner 1000 is the all-in-one machine, the air conditioner 1000 may be a window machine, a mobile air conditioner, and the like, and details thereof will be omitted herein.

In addition, it should be noted that, the electric control component 100 according to the embodiments of the present disclosure is not limited to be applied in the air conditioner 1000, and may also be applied in any other environments requiring the electric control component 100, for example, a small operating device, a large operating device, or the like, and details thereof will be omitted herein.

In the description of this specification, descriptions with reference to the terms "an embodiment", "some embodiments", "illustrative embodiments", "a specific example", "some examples", etc., mean that specific features, structure, materials, or characteristics described in conjunction with the embodiment or example are included in at least one embodiment or example of the present disclosure. In this specification, the schematic representations of the above terms do not necessarily refer to the same embodiment or example. Moreover, the described specific features, structures, materials, or characteristics may be combined in any one or more embodiments or examples in a suitable manner. In addition, those skilled in the art can combine the different embodiments or examples and the features of the different embodiments or examples described in this specification without contradicting each other.

Although the embodiments of the present disclosure have been illustrated and described, it is conceivable for those of ordinary skill in the art that various changes, modifications, replacements, and variations can be made to these embodiments without departing from the principles and spirit of the present disclosure. The scope of the present disclosure shall be defined by the claims as appended and their equivalents.

What is claimed is:

1. An electric control component for an outdoor unit of an air conditioner, the electric control component comprising:
   a circuit board;
   a chip disposed on the circuit board;
   a radiator disposed at a side of the chip away from the circuit board;
   a pre-tightening device engaging with an engagement portion disposed on at least one of the circuit board or the radiator at a first location to clamp the radiator and the circuit board; and a fixing member engaging with the circuit board and the radiator at a second location that is separate from the first location to connect the radiator to the circuit board, wherein:

the engagement portion comprises a second through hole formed on the radiator at the first location and a second via hole formed on the circuit board at the first location;

the pre-tightening device comprises a mounting member passing through the second through hole and the second via hole;

the pre-tightening device further comprises a spring member sleeved over the mounting member;

the mounting member and the spring member provide an elastic force clamping the radiator and the circuit board; and a diameter of the mounting member is larger than that of the fixing member.

2. The electric control component according to claim 1, wherein:

the fixing member is soldered to the circuit board; and/or the fixing member is riveted to the radiator.

3. The electric control component according to claim 2, wherein:

a first through hole is formed on the radiator at the second location;

a first via hole is formed on the circuit board at the second location; and the fixing member has a head portion and a rod portion, the head portion being riveted to the first through hole, and the rod portion passing through the first via hole and being soldered into the first via hole.

4. The electric control component according to claim 3, wherein:

a plane perpendicular to an axis of the rod portion is defined as a projection plane;

a projection area of the head portion on the projection plane is greater than a projection area of the rod portion on the projection plane; and the projection area of the head portion on the projection plane is greater than a projection area of the first via hole on the projection plane.

5. The electric control component according to claim 1, wherein the engagement portion comprises:

a second through hole formed on the radiator at the first location; and a second via hole formed on the circuit board at the first location.

6. The electric control component according to claim 5, wherein the radiator comprises:

a body portion; and two connection portions disposed on two sides of the body portion in a first direction, the second through hole being formed on one of the two connection portions.

7. The electric control component according to claim 6, wherein the first through hole has a diameter that is unequal to a diameter of the second through hole.

8. The electric control component according to claim 1, further comprising the pre-tightening device engaged with the engagement portion, wherein:

the pre-tightening device clamps the radiator and the circuit board, or the pre-tightening device positions the radiator and the circuit board in a plane perpendicular to a clamping direction.

9. The electric control component according to claim 8, wherein:

the radiator comprises:

a body portion; and two connection portions disposed on respective sides of the body portion in a first direction; and the pre-tightening device and the fixing member are disposed through one of the two connection portions.

10. The electric control component according to claim 1, wherein:

the mounting member comprises:

a penetrating portion passing through the second through hole and the second via hole;

a first abutting portion connected to the penetrating portion and limited on a side of the circuit board away from the radiator; and a second abutting portion connected to the penetrating portion and limited on a side of the radiator away from the circuit board; and the spring member is disposed between the first abutting portion and the circuit board or between the second abutting portion and the radiator.

11. The electric control component according to claim 10, wherein:

the first abutting portion is a first elastic snap limited on the side of the circuit board away from the radiator; and/or the second abutting portion is a second elastic snap limited on the side of the radiator away from the circuit board.

12. The electric control component according to claim 1, wherein:

the electric control component further comprises a thermally conductive member disposed between the radiator and the chip; or the chip is an intelligent power module with a patch disposed on the circuit board.

13. An air conditioner comprising:

the electric control component according to claim 1; and a plurality of power-consumption operation components, wherein the electric control component is electrically connected to at least one of the power-consumption operation components; or an indoor unit and an outdoor unit, wherein the electric control component is disposed in the outdoor unit.

14. The electric control component according to claim 1, further comprising another fixing member connecting the radiator to the circuit board in a third location, wherein:

at least one of the circuit board or the radiator has another engagement portion adapted to be engaged with another pre-tightening device;

the other engagement portion is in a fourth location that is separate from the third location; and the other engagement portion is configured to, in conjunction with the other pre-tightening device, clamp the radiator and the circuit board.

15. The electric control component according to claim 14, wherein:

the fixing member and the engagement portion are disposed on one side of the radiator in a first direction; and the other fixing member and the other engagement portion are disposed on another side of the radiator in the first direction.

16. The electric control component according to claim 15, wherein:

the fixing member and the other fixing member are
   disposed on opposite sides of the radiator in a second
   direction that is perpendicular to the first direction; and
the engagement portion and the other engagement portion
   are disposed on opposite sides of the radiator in the
   second direction.

<div align="center">*   *   *   *   *</div>